United States Patent [19]

Wright

[11] 4,412,349

[45] Oct. 25, 1983

[54] REMOTE DISPLAY OF PERCENTAGE MODULATION DATA OBTAINED AT A TRANSMITTER SITE

[75] Inventor: Charles S. Wright, Springfield, Va.

[73] Assignee: Delta Electronics, Inc., Alexandria, Va.

[21] Appl. No.: 313,238

[22] Filed: Oct. 19, 1981

Related U.S. Application Data

[63] Continuation-in-part of Ser. No. 255,345, Apr. 17, 1981, abandoned, which is a continuation of Ser. No. 129,311, Mar. 11, 1980, abandoned.

[51] Int. Cl.³ .................. H04B 3/46; H04B 17/00
[52] U.S. Cl. ............................... 455/67; 340/722; 375/36; 455/115
[58] Field of Search .......... 455/9, 67, 115; 332/39; 375/25, 36; 340/722, 723, 740, 800

[56] References Cited

U.S. PATENT DOCUMENTS

| | | | |
|---|---|---|---|
| 1,604,610 | 10/1926 | Schelleng | 332/39 |
| 2,074,737 | 3/1937 | Wolff | 332/39 |
| 2,078,285 | 4/1937 | Schrader | 332/39 |
| 2,779,868 | 1/1957 | Rust, Jr. | 455/92 |
| 2,880,395 | 3/1959 | MacDowell | 455/115 |
| 3,343,030 | 9/1967 | Dragon et al. | 340/212 |
| 3,345,625 | 10/1967 | Russell et al. | 340/212 |
| 3,571,760 | 3/1971 | Schwartz et al. | 455/115 |
| 3,621,397 | 11/1971 | Murotani et al. | 375/25 |
| 3,641,554 | 2/1972 | Slavin | 340/212 |
| 3,678,498 | 7/1972 | Nagamatsu et al. | 340/722 |

FOREIGN PATENT DOCUMENTS 608109  5/1978  U.S.S.R. ............................ 455/115

*Primary Examiner*—Marc E. Bookbinder
*Attorney, Agent, or Firm*—Mason, Fenwick & Lawrence

[57] ABSTRACT

A method and apparatus is disclosed for the remote display of percentage modulation data obtained at a transmitter site. A modulation monitor at the transmitter site produces a positive excursion of the audio wave modulation of a carrier wave proportional to percentage modulation of a carrier wave. A special rectifier circuit having the "semi-peak" response characteristics specified by the FCC for the indicating meter of the modulation monitor is used to measure the excursions of the audio wave. The DC output of the rectifier circuit is sampled periodically and converted to parallel digital data by a standard analog to digital converter. This data is converted into a serial data stream by a parallel to serial converter for transmission through a conductor to the remote site. The serial data received at the remote site is reconverted to parallel data which is fed to a down counter. A timing circuit causes the down counter to be periodically preset to the value of the parallel data word and initiates the beginning of a bar graph video pulse. The down counter is decremented by a clock oscillator. When the down counter reaches the count of zero, it terminates the video bargraph pulse, thus the duration of the bargraph pulse is determined by the value of the data word preset in the down counter. The bargraph pulse is displayed on a TV display screen along with scale marking representative of percentage modulation from 0–130%. The timing circuit starts the bargraph pulse at the desired location on the screen and for the desired number of scan lines.

8 Claims, 12 Drawing Figures

AMPLITUDE MODULATED
RF CARRIER

DETECTED RF WAVE

DETECTED WAVE WITH
DC COMPONENT REMOVED

INVERTED

TONE BURST RESPONSE
OF RECTIFIER CIRCUIT

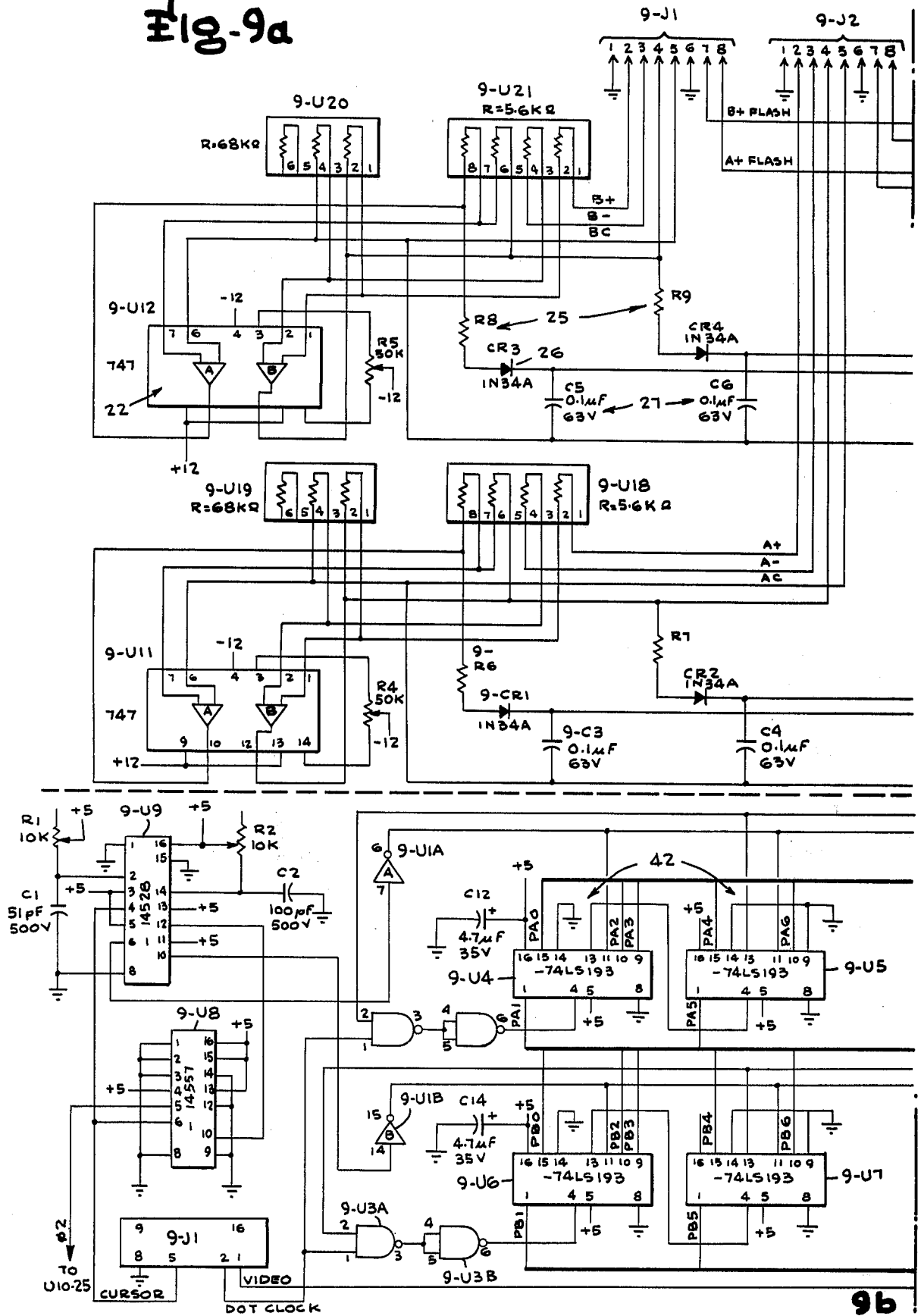

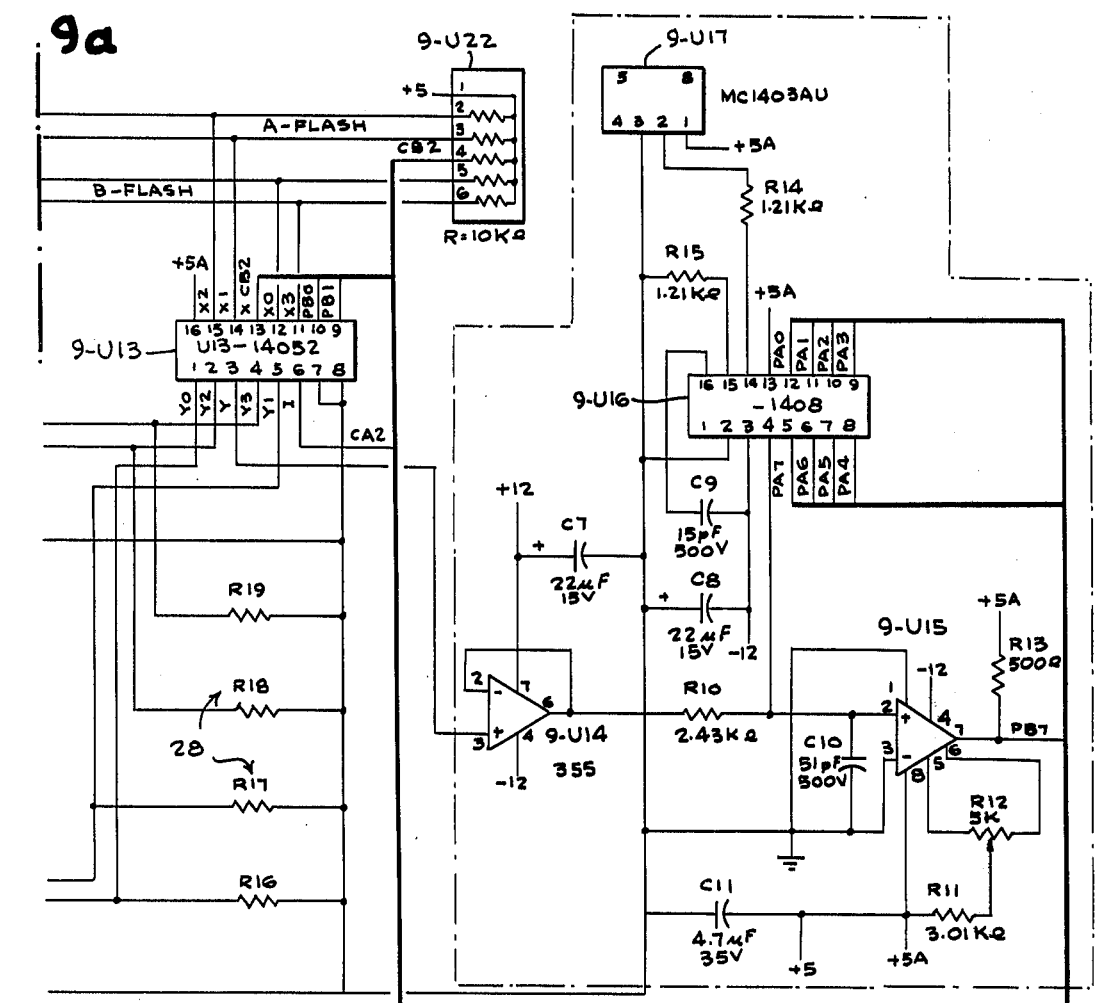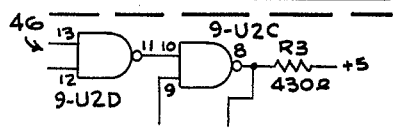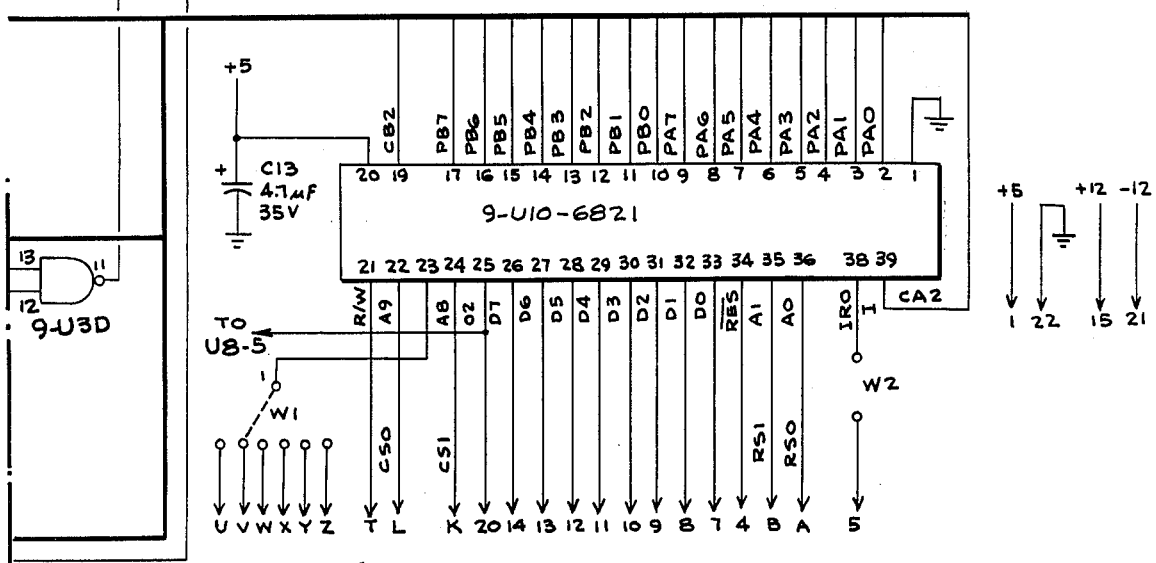

REMOTE DISPLAY OF PERCENTAGE MODULATION DATA OBTAINED AT A TRANSMITTER SITE

This application is a continuation-in-part of my earlier application Ser. No. 255,345 filed Apr. 17, 1981, now abandoned which was a continuation of application Ser. No. 129,311 filed Mar. 11, 1980, now abandoned.

BACKGROUND AND OBJECTS OF THE INVENTION

1. Field of the Invention

This invention relates to a method and apparatus for the remote display of percentage modulation data obtained at a transmitter site, and more particularly to a method and apparatus which will accomplish the accurate transmission and display of percentage modulation data obtained from a modulation monitor at a transmitter site and transmitted by conductive means to the remote site.

The Federal Communications Commission (FCC) requires the continuous monitoring of the modulation of all broadcast stations including amplitude modulated (AM), frequency modulated (FM) and television (TV). The equipment used to measure percentage modulation is called a modulation monitor. Its accuracy and other characteristics are specified in the Rules and Regulation of the FCC. Modulators are type approved by the FCC at their laboratory in Laurel, Maryland. Broadcasters are required to have a modulation monitor at the transmitter location and, if they operate with remote control, a second monitor at the remote control position.

Proper operation of the monitor at the remote control point is often very difficult to achieve. This is because the "off the air" carrier sample is not sufficiently pure for accurate measurements. This can be particularly true for the most critical measurement of 100% negative modulation of AM carriers. Even small local noise sources may contaminate the carrier sample to preclude accurate measurements. Of course, there is also the disadvantage of the expense of the second monitor.

2. Discussion of the Prior Art

Patents representative of the known prior art are:
U.S. Pat. No. 2,074,737
U.S. Pat. No. 2,078,285
U.S. Pat. No. 2,496,259
U.S. Pat. No. 2,779,868
U.S. Pat. No. 3,343,030
U.S. Pat. No. 3,345,625
U.S. Pat. No. 3,641,554.

U.S. Pat. Nos. 2,074,737 and 2,078,285 both broadly disclose the use of cathode ray tubes for visual display of modulation information, however, the systems disclosed are quite different and non-suggestive of the invention disclosed herein. U.S. Pat. No. 2,078,285 relates to a system for determining the character and percentage of modulation of a radio transmitter at a point remote from the transmitter. Unlike the system of the present invention which measures percentage modulation at the transmitter and produces a digital representation of percentage modulation which is transmitted conductively to a remote site where the digital value is used in creating a bar graph pulse representing the digital value which is displayed on a TV display, the system disclosed in U.S. Pat. No. 2,078,285 derives modulation information from a radio signal received at a station remote from the transmitter. The system disclosed in U.S. Pat. No. 2,078,285 is therefore subject to inaccuracies resulting from contamination of the carrier sample during transmission which the present invention is designed to avoid.

U.S. Pat. No. 2,779,868 discloses a radio remote control system having a meter for indicating percent modulation, however, no description of the operation of the percent modulation meter appears in the specification.

U.S. Pat. Nos. 3,343,030 and 3,345,625 broadly disclose apparatus for producing bar graph displays, and U.S. Pat. No. 3,641,554 discloses a system which converts analog data from a number of sources to digital form, stores the digital data in a memory having a plurality of channels, selectively retrieves digital data from any one of the channels and converts it back to analog form for graphic display as a trace on a cathode ray tube.

The method and apparatus of the invention disclosed herein is not suggested by any of the prior art patents listed above.

SUMMARY OF THE INVENTION

It is an object of this invention to provide a method and apparatus for measuring the percentage modulation of a carrier wave at the site of the transmission of the modulated carrier wave, producing a digital parallel data representation of the measured percentage modulation, converting the digital parallel data into serial form, transmitting the digital data in serial form through a conductor to a remote station, reconverting the digital data from serial form to parallel form, producing a bar graph pulse whose length corresponds to the value of the digital data received from the transmitting site, displaying the bar graph pulse on a TV display as an illuminated bar which begins at a desired point on the TV screen corresponding to zero percentage modulation, and providing scale markers across the screen parallel to the bar indicating percentage values from which the percentage value of the bar graph can be read.

A further object of this invention is to provide a system for displaying percentage modulation at a remote station as described above, and auxiliary information including positive and negative over modulation alarm signals.

BRIEF DESCRIPTION OF THE DRAWINGS

With the foregoing objects and features in view and such other objects and features which may become apparent as the specification proceeds, the invention will be understood from the following description taken in conjunction with the accompanying drawings, wherein like characters of reference designate like parts and wherein:

FIGS. 7a–b, 8a–b and 9a–b are schematic diagrams of circuits which may be used to produce the scale, overmodulation alarm and illuminated alarm marks and properly locate the bar graph in the display.

DETAILED DESCRIPTION OF THE PREFERRED EMBODIMENT

Figure 1:
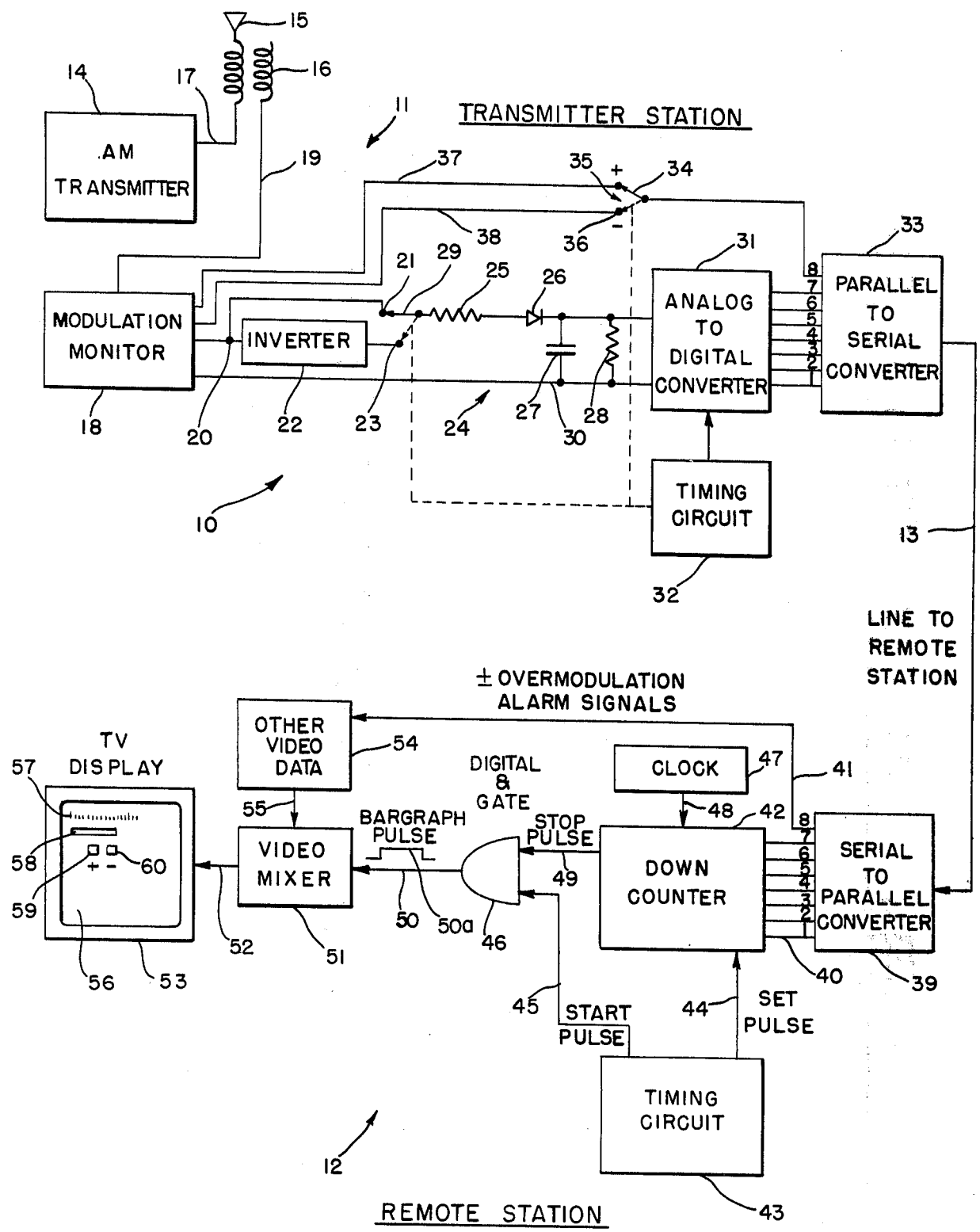
FIG. 1 is a block diagram illustrating the invention and showing certain elements schematically.
Figure 2:
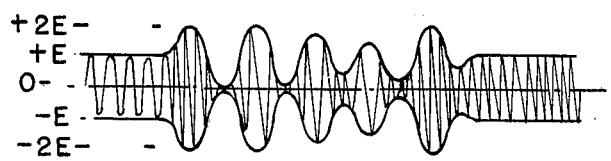
FIG. 2 is a graph of an amplitude modulated RF carrier wave.

The percentage modulation remote display system of this invention is generally indicated in FIG. 1 of the drawings by the reference numeral 10. The system 10 includes a transmitter station, generally indicated at 11, where a modulated radio frequency signal to be monitored is generated and transmitted, and a remote station, generally indicated at 12, connected by a signal transmission line 13 to the transmitter station where apparatus for monitoring the transmitter station is located. The remote station 12 will usually include apparatus for the control of the transmitter station 11, however, the control apparatus is not part of the present invention for which reason it is not shown.

An amplitude modulated radio transmitter 14, located at the transmitter station 11 produces an amplitude modulated radio frequency signal which is transmitted through the atmosphere via an antenna 15. The signal being transmitted is sampled by an inductive or other signal coupling means 16 located in the output line 17 from the transmitter 14 to the antenna 15. The sampled amplitude modulated signal is fed from the signal coupling means 16 to a percentage modulation monitor 18 via an input line 19. The percentage modulation monitor 18 is of a known type, which for example, may be the AM Modulation Monitor AMM-2A manufactured by Blear Electronics Laboratory Inc.

Figure 3:
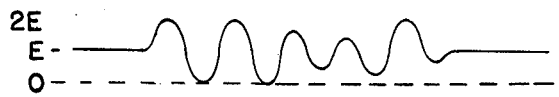
FIG. 3 is a graph of the positive audio excursion of the wave shown in FIG. 2.
Figure 4:
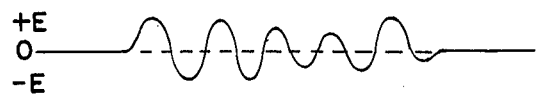
FIG. 4 is a graph of the audio excursion shown in FIG. 3 with its DC component removed.
Figure 5:
FIG. 5 is a graph showing the wave form of FIG. 4 inverted.
Figure 6:
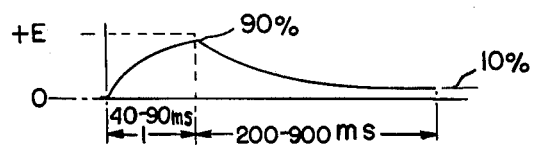
FIG. 6 is a graph showing the tone burst response of a rectifier circuit required by the FCC.

FIGS. 2 through 5 illustrate how the carrier rectifier in an AM modulation monitor derives the audio waves needed for modulation measurement. The amplitude modulated RF carrier wave from the transmitter 14, which is sampled by the coupling transformer 16 and fed to the modulation monitor 18, is represented by the wave form shown in FIG. 2. A detector circuit (not shown) within the modulation monitor 18 produces a detected RF wave form as shown in FIG. 3. Removal of the DC component from the detected wave form shown in FIG. 3 by circuit means within the modulation monitor provides the wave form shown in FIG. 4. When the peak positive value of the wave form shown in FIG. 4 reaches E, 100% positive amplitude modulation has occurred. The positive modulation wave form represented in FIG. 4 is present at circuit points 20 and 21 shown in FIG. 1. An inverter 22 inverts the wave form shown in FIG. 4 and provides an inverted wave form represented in FIG. 5 at circuit point 23. The value E of the wave form shown in FIG. 5 (the inverse of FIG. 4) represents 100% negative amplitude modulation. A special rectifier circuit 24 is used to measure the wave forms 4 and 5 alternatively through a periodic switch 29 which alternately samples the wave forms at points 21 and 23. The rectifier circuit 24 has the "semi-peak" response characteristics specified by the FCC for the indicating meter (not shown) of the modulation monitor. The circuit 24 includes a resistor 25 in series with a diode 26, and a capacitor 27 connected in parallel with a resistor 28 between the cathode terminal of the diode 26 and conductor 30. The resistor 25 controls the rise time, and the resistor 28 the decay time of the rectifier circuit 24. The FCC specification for these response times is illustrated in FIG. 6.

The DC output of the rectifier circuit 24 is converted to parallel digital data by a standard A/D (analog to digital) converter 31. The converter 31 as shown in FIG. 1 produces 7-bit data, however, converters which produce data of a greater of less number of bits may be used. Sixty conversions per second are made under the control of a timing circuit 32. The timing circuit 32, which includes an oscillator operating at a predetermined frequency, also controls the periodic switch 29 so as to switch the input connection of the rectifier circuit 24 alternately between the positive modulation contact 21 and the inverted negative modulation contact 23 to take thirty samples of positive modulation and thirty samples of inverted negative modulation each second. The data from the A/D converter 32 is converted into a serial data stream by a parallel to serial converter 33, of a conventional type, for transmission over the transmission line 13 to the remote station 12. The parallel to serial converter 33, as shown, includes in addition to the 7-bit input terminals from the A/D converter 31 another input terminal which receives over modulation alarm signals from the over modulation alarm switch 34. The modulation alarm switch 34 under control of the timing circuit 32 alternates 30 times per second between the positive over modulation alarm contact 35 and the negative over modulation alarm contact 36. The modulation monitor 18 includes means for producing a positive over modulation alarm signal when the sampled positive modulation exceeds a predetermined percentage value, and means for producing a negative over modulation alarm signal when the sampled negative modulation exceeds a predetermined percentage value. The positive and negative over modulation alarm signals are fed to the contacts 35 and 36 respectively over lines 37 and 38.

The serial data from the parallel to serial converter 33 at the transmitter station 11 is received at the remote station 12 via the line 13 and reconverted to parallel data by a serial to parallel converter 39. The 7-bit digital data corresponding to 7-bit data word from the A/D converter 31 is fed over seven parallel conductors generally indicated at 40 to a down counter 4. A timing circuit 43 causes the down counter 42 to be preset by a signal applied over conductor 44 to the 7-bit value of the data word supplied from the serial to parallel converter 39, and initiates the beginning of a bar graph video pulse 50a by a signal supplied over conductor 45 to one input terminal of the digital AND-gate 46. The down counter 42 is connected through a conductor 49 to the second input terminal of the digital AND gate 46. The down counter 42 is decremented by a clock oscillator 47 connected to the down counter by conductor 48. When the down counter reaches the count of zero, it terminates the video bar graph pulse which is fed from the output of the digital AND gate 46 over conductor 50 to one input of video mixer 51. Thus, the duration of the bar graph pulse 50a is directly determined by the value of the 7-bit data word supplied to the down counter 42.

The video mixer 51 mixes video data from other sources with the bar graph pulse and feeds the combined video signals to the video input terminal of a TV display device 53 of a known type.

The video mixer 51 mixes video data from other sources with the bar graph pulse and feeds the combined video signal to the video input terminal of a TV display device 53 of a known type. The visual result of the video signals supplied to the TV display device 53 from the video mixer is shown on the face 56 of the cathode ray tube of the display device. The video display shown includes a scale 57 representing values of percentage modulation from 0 to 130%, a bar graph 58 extending horizontally below the scale 57 and representing the percentage AM modulation of the signal being transmitted by the transmitter 14, and positive and negative over modulation alarm indications 59 and 60 provided such over modulation conditions exist. The timing circuit 43 starts the bar graph pulse 58 at the desired location on the screen and for the desired number of scan lines.

Positive and negative over modulation alarm signals are fed from the serial to parallel converter 39 over conductor 41 to the box 54 marked other video data. Circuit means is included in the box 54 to cause the display of over modulation alarm indications 59 and/or 60 when positive or negative over modulation conditions exist.

The other video data box also includes circuit means to produce the scale 57 shown on the TV tube face 56. The zero indicator mark on the scale 57 is above and vertically aligned with the beginning of the bar graph 58. By observing the location of the end of the bar graph pulse 58 with respect to the scale mark vertically above it, the percentage modulation value represented by the bar graph pulse can be read.

Figure 7A:
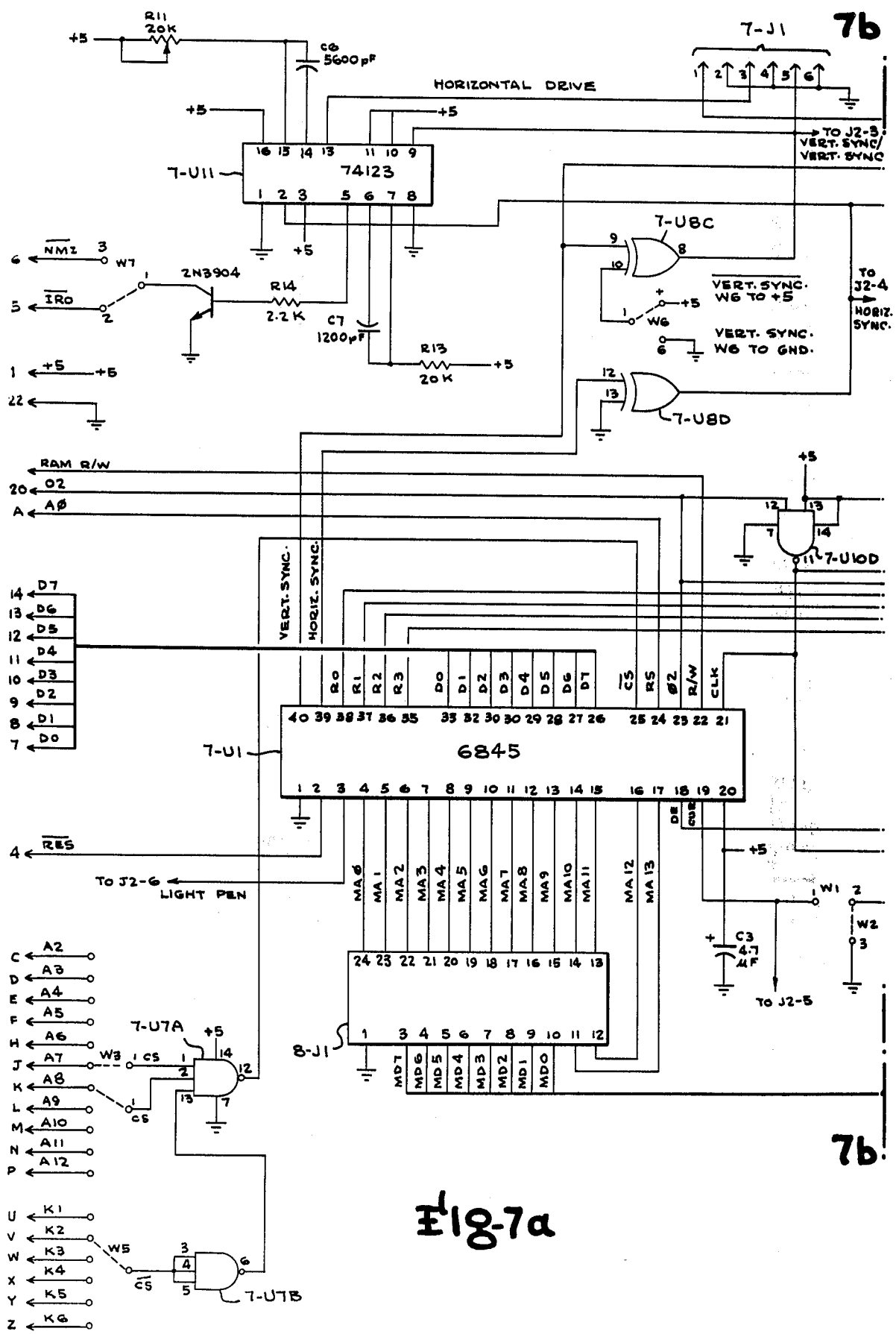
Figure 7B:
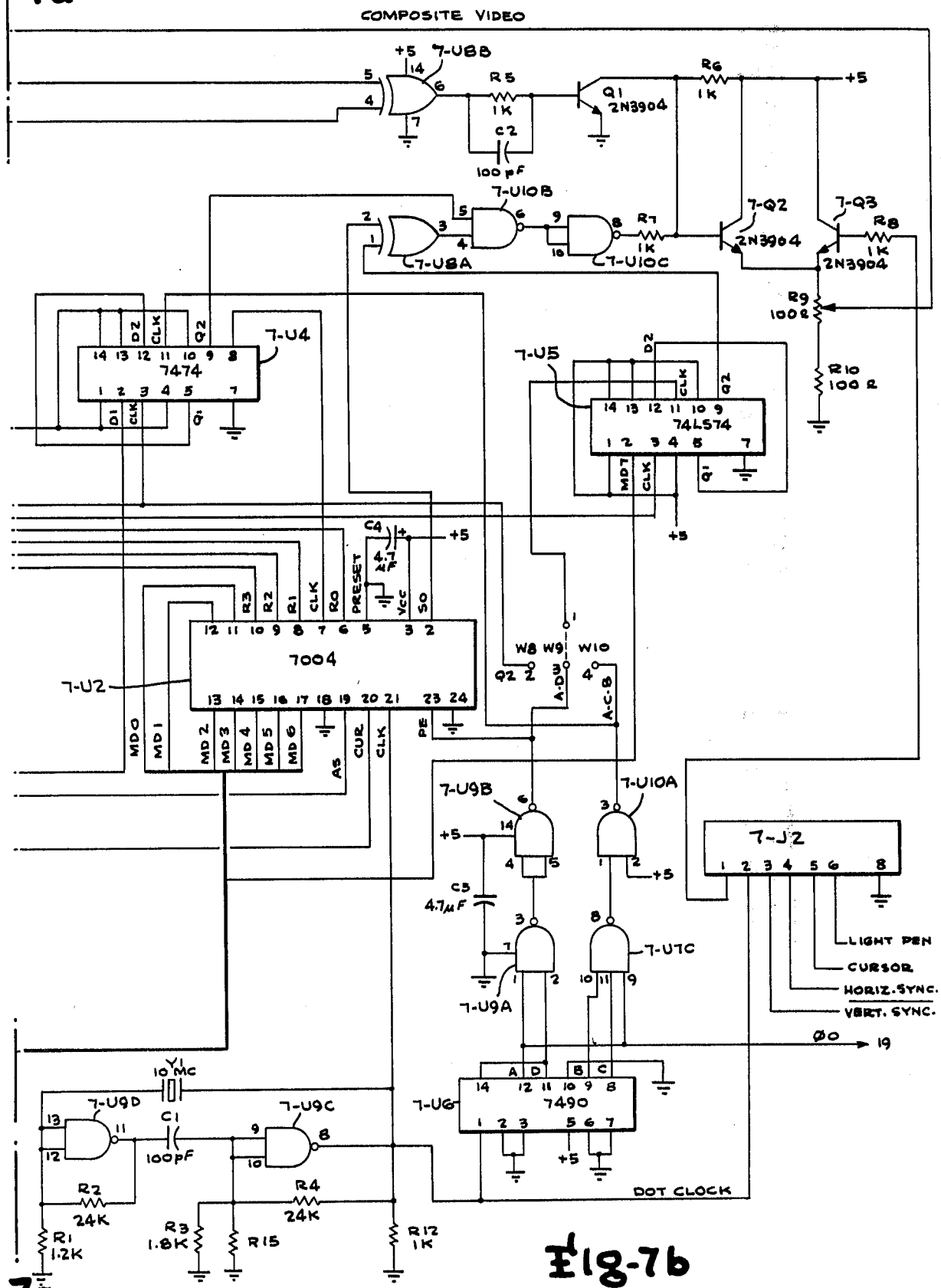
Figure 8A:
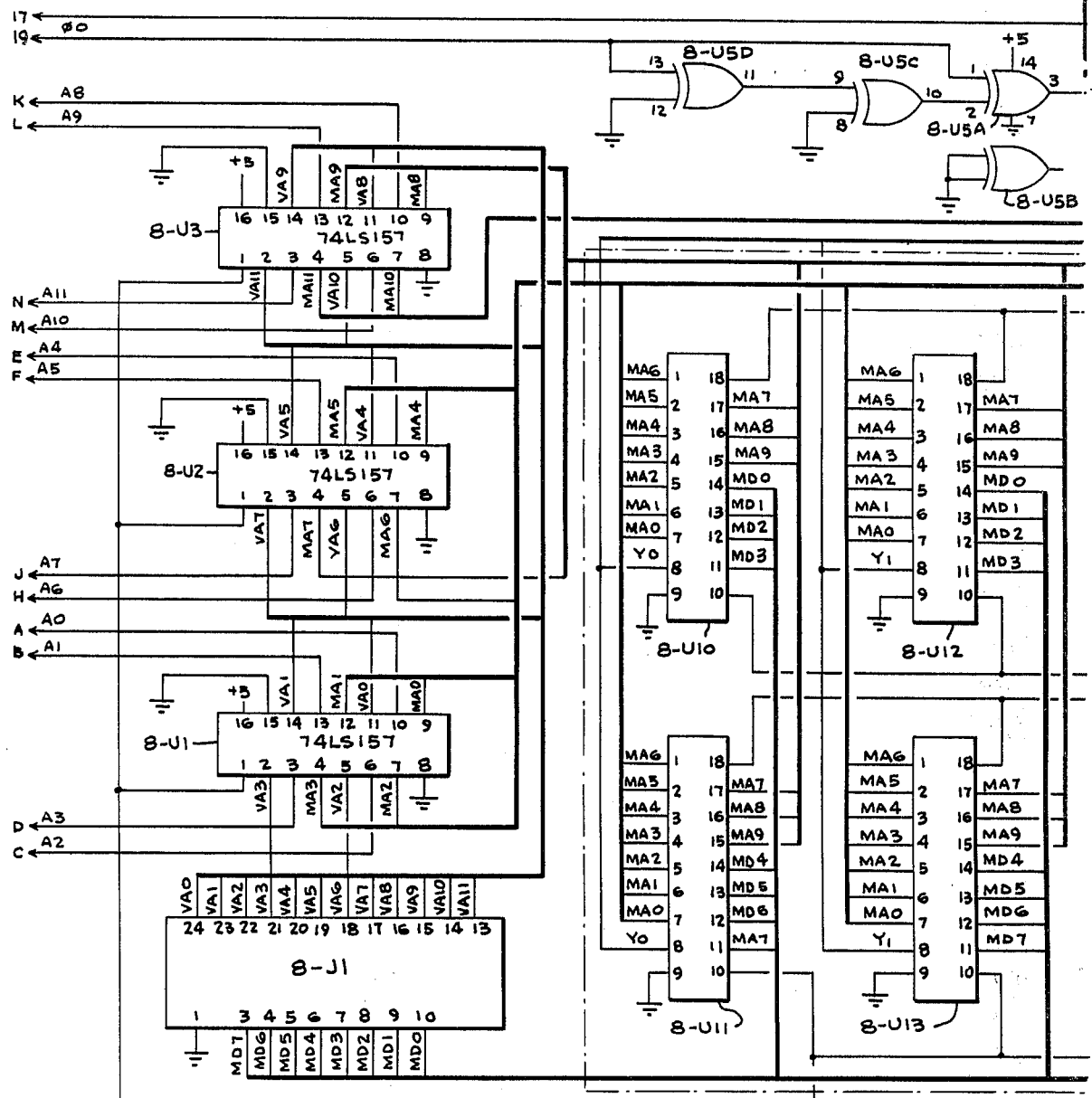
Figure 8A:
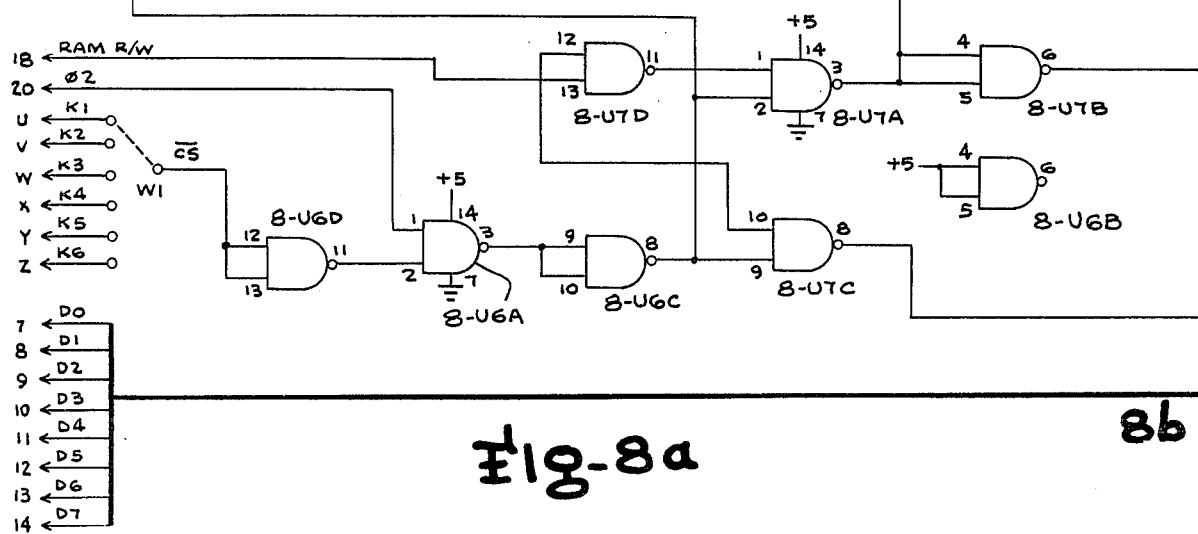
Figure 8B:
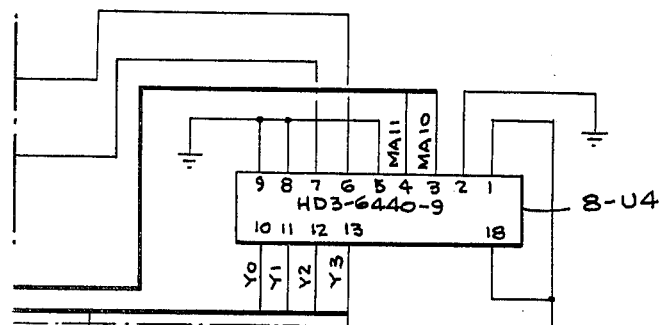
Figure 8B:
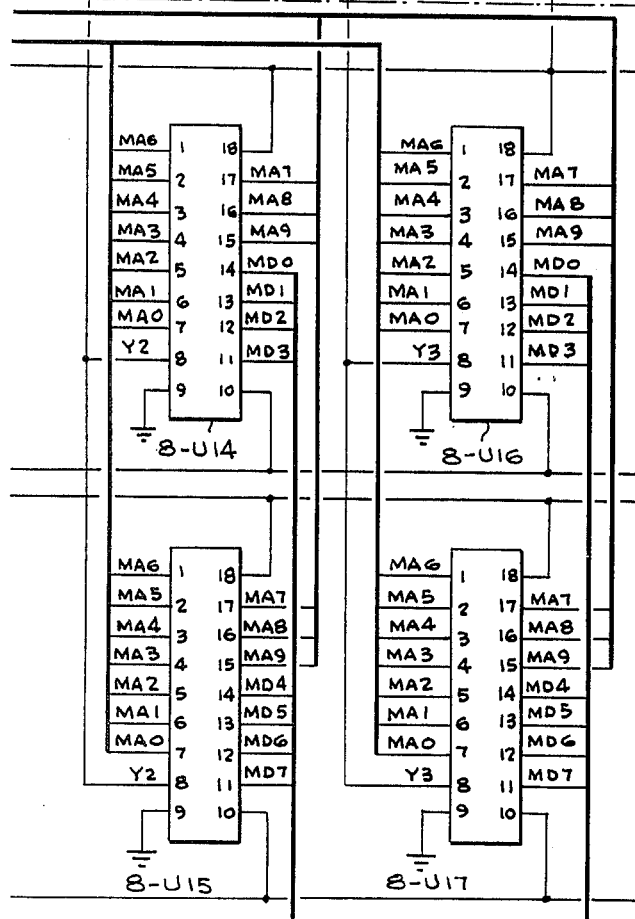
Figure 8B:
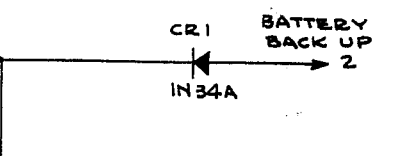
Figure 8B:
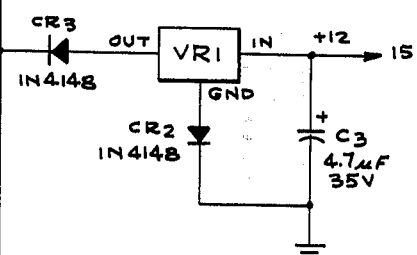
Figure 8B:
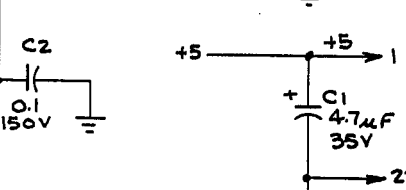
Figure 8B:
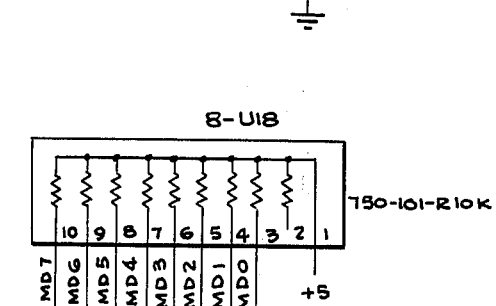
Figure 8B:
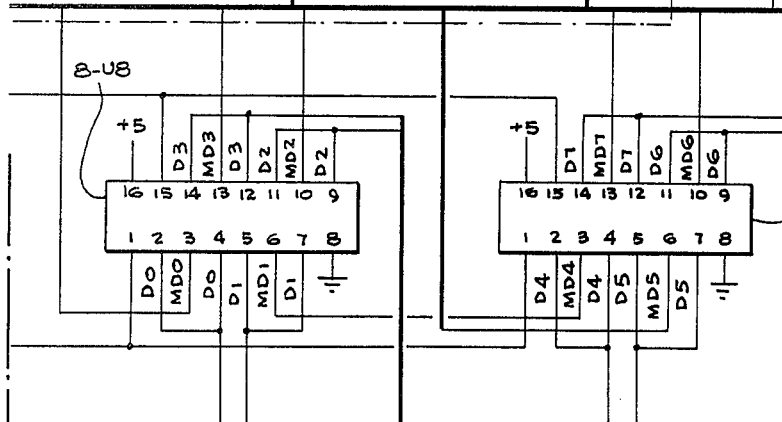

Referring now to FIGS. 7a, 7b, 8a, 8b and 9a, 9b illustrating schematic diagrams of solid state circuitry which may be used to provide various previously described functions, such as circuitry for producing the scale 57, the bar graph 58, and the illuminated alarm marks 59 and 60, these figures illustrate schematically the subassemblies which I refer to as the video assembly, the video memory assembly, and the modulation display assembly, for a commercially preferred embodiment of the remote percentage modulation data display system of the present invention for use with 2 percentage modulation monitors for monitoring 2 station transmitters rather than a single modulation monitor. FIGS. 7a, 7b illustrate schematically the video assembly for such a 2 modulation monitor system which provides the video signals, corresponding to the contents of the video memory assembly of FIGS. 8a, 8b to the cathode ray tube display 53, together with composite video for an external monitor, a vertical sync and horizontal drive for the video display 53, timing signals for the bar graph circuit later described, and synchronous 1 MHz clock signals for the system control microprocessor by which the system is programmed to perform the desired functions. FIGS. 8a, 8b form a schematic diagram of the video memory assembly used as a refresh memory for the video display on the CRT display 53 which is interconnected with the video assembly of FIGS. 7a, 7b by connection of the plug 7-J2 with the plug 8-J1. The modulation display assembly of FIGS. 9a, 9b includes many of the elements previously described such as the inverter 22, the resistor 25, diode 26, capacitor 27 and resistor 28 illustrated in FIG. 1 as well as the down counter 42, AND gate 46 and analog to digital converter 31 shown in FIG. 1 and also identified in FIGS. 9a, 9b.

Referring more particularly to FIG. 7a, 7b integrated circuit chip 7-U1, which is a CRT controller, for example an MC 6845 produced by Motorola, Inc., is the general controller for the video display and is programmed for display attribute through the bus system 7-MB connected to the system control microprocessor, and is coupled to the dot matrix character generator 7-U2, for example a CRT 7004 integrated circuit chip, and, through the plug 7-J2 of FIG. 7a and 8-J1 of FIG. 8a is connected to the video refresh memory 8-RM of FIG. 8b, formed for example of 8 integrated circuit chips 8-U10 through 8-U17 of FIG. 8a, 8b. The CRT controller 7-U1 addresses the video refresh memory 8-RM and times the dot matrix character generator 7-U2. 7-U2 contains the read-only memory for a 128 character set and a shift register for producing serial video output on its pin number 2. To produce the scale 57 on the screen, only the characters lower case 1 and the apostrophe of the dot matrix character generator 7-U2 are used, which are stored in the refresh video memory 8-RM at the appropriate character locations, to produce the long and short vertical lines making up the scale 57. 7-U9C and 7-U9D form a 10 MHz dot clock oscillator which clocks the shift register and provides clocking for the bar graph circuit through plug 7-J2. 7-U6, for example a 7490 integrated circuit chip, is a divide by 10 counter circuit which produces the 1 MHz phase 0 clock for the system control microprocessor and timing signals for the blanking flip-flop 7-U4, a reverse video flip-flop 7-U5 and shift register loading. The output signals of 7-U6 are decoded by 7-U9A and 7-U9B and by 7-U7C and 7-U10A.

7-U10D provides the address strobe for the character generator 7-U2. Data in the video refresh memory on the lead 7-MD0/7 form the address for the character 7-U2. The eight bit word on 7-MD7 drives the reverse video flip-flop 7-U5, 0 for normal video and 1 for reverse video.

Serial video output from the shift register is delivered to 7-U8A, an exclusive OR gate used as a programmed inverter. When the second input of this gate is high (driven by the reverse video flip-flop 7-U5) its output is inverted. 7-U10B mixes the blanking signals from the blanking flip-flop 7-U4. 7-10C buffers the video signals to drive the video mixer 7-Q2 and 7-Q3. Sync signals are added to this mixer by transistor 7-Q1. A vertical sync comes directly from the CRT controller 7-U1 and horizontal sync comes from 7-U1 and is buffered by 7-U8D. These are mixed in 7-U8B which drives 7-Q1.

The video memory assembly, shown in FIGS. 8a, 8b is used as a refresh memory for the video display, and is made up principally of memory chips 8-U10 through 8-U17. They are used in pairs to provide 1024 bytes per pair. Associated with them are the address multiplexers 8-U1 to 8-U3 and the data multiplexers 8-U8 and 8-U9, in the manner shown. These provide not only the address information for the character generator 7-U2 to form the lower case 1 and apostrophe characters to make up the scale 57 at the proper scan positions for the appropriate scan line, and tell the CRT controller 7-U1 to produce a cursor pulse at the proper scan position for 5 scan lines to initiate the 5 scan line display of the bar graph 58, but also provide the memory for one or more pages of other character data displays below the bar and alarm displays. In the embodiment illustrated in FIGS. 8a, 8b a sufficient number of memory chips are provided to provide three pages of additional display data. If only two pages of display data are required, memory chips 8-U14 and 8-U15 may be eliminated and 8-U16 and 8-U17 may be used to store the channel definitions and calibration data for those channels assigned to the second page of data. 8-U4 decodes address lines to select the 4 pairs of chips 8-U10 to 8-U17 and 8-U6 and 8-U7 elements form board decode logic and multiplexer drive logic.

The modulation display circuit illustrated in FIGS. 9a, 9b includes many of the components shown in broad block diagram designations of FIG. 1 and have been so indicated in broken lines and reference characters on FIGS. 9a, 9b. The circuit above the dashed line receives audio voltage and flasher switch closures from the modulation monitor, or in this case from the 2 modulation monitors since this is a 2 monitor installation, and includes connections for converting this information to digital data for delivery to the system control microprocessor. The circuitry below the dashed line of FIG. 9 has connections for accepting digital data from the system control microprocessor and converting it to bar graph video pulses for display by the video assembly of FIGS. 7a, 7b. The percentage monitoring unit for the transmitter station has all of the circuitry shown, while an installation for a studio unit omits the components above the dashed line.

Integrated circuit chip 9-U10, which may be a 6821 integrated circuit chip, referred to as a peripheral interface adapter, is provided to select and connect to the system control microprocessor those parts of the circuit required. The amplifier 9-U11B is a unity gain inverting amplifier taking the input from 9-U11A and driving rectifier circuits 9-R6, 9-CR1, 9-C3 and 9-R16, which correspond to inverter 22, resistor 25, diode 26, capacitor 27, and resistor 28 of FIG. 1. Thus the positive and negative sides of the audio are rectified and made available to the analog selector 9-U13, which may be a 14052 integrated circuit chip. The audio source from the second transmitter being monitored, in the 2 monitor installation, is similarly processed. 9-U13 selects 1 of the DC outputs of the 4 rectifier circuits (in the 2 modulation monitor installation), by a 2 digit word applied to it, delivered by the chip 9-U10, and the output of 9-U13 is applied to 9-U14, a high impedance buffer amplifier that takes this output and causes a current to flow into the input of comparitor chip 9-U15. 9-U16 is a resistance ladder chip which also delivers a current to the comparitor 9-U15, derived from a precision reference voltage generated by 9-U17, the resistance ladder being switched, in a successive approximation algorithm, to make the 2 currents equal, to produce a condition producing an 8-bit word equivalent to the DC voltage, the most significant bit of which is used to transmit flasher information to the studio unit.

The flasher input terminals, which are pin 7 and 8 of plugs 9-J2 and 9-J3, are pulled up to 5 volts by the resistors of 9-U22. Where a flasher terminal is short at the ground, this voltage would drop to logic 0. The flasher inputs are selected by 9-U13 and routed to the system control microprocessor through 9-U10. The microprocessor takes the first 7 bits from the A/D converter and adds the status of the selected flasher as the most significant bit to form a 8-bit word for serial transmission to the studio unit.

The circuitry below the dashed line takes the 7 bit A/D word, directly from the microprocessor in the transmitter unit and as received by the microprocessor from the serial data in the studio unit, and converts it to the bar graph display video pulses. The data appears on the pins PA0 through PA6 of 9-U10. 5 cursor pulses generated by the CRT control chip 7-U1, occuring on the left edge of the display on 5 scan lines of character row two are delayed by the one shot multivibrator (one half of 9-U9) to form a start pulse for the bar graph display (specifically the left bar graph display of the 2 monitor installation). The delay is adjusted by 9-R1 so that 0 is at the left edge of the bar with the bar graph scale. This pulse loads through 9-U1A the word into the down counters 9-U4 and 9-U5 (one of which corresponds to down counter 42 of FIG. 1). The "carry" output of 9-U5 goes high switching on the 10 MHz dot clock to the down counter. There are 10 dot clock pulses per character space and the bar graph scale has 1 mark per character space. Thus each count represents 1 percent modulation. When the counters reach 0 the "carry" output of 9-U5 goes low stopping on the dot clock input. Thus the "carry" output remains high from the start pulse to the number of counts loaded into the counter. The output of the gate 9-U2D, therefore, has a low going pulse equal to the length of the bar graph 58, which would be the left bar graph in the 2 monitor installation example. Bit 8 of the bar graph data is interpreted by the system control microprocessor, directly, to cause the − or + symbols to reverse video. 9-R1 (or 9-R1 and 9-R2 in the illustrated 2 monitor example) on this modulation display assembly of FIGS. 9a, 9b is/are used for adjusting the start pulses to "0" on the bar graph display. When this pulse approximately coincides with a dot clock pulse, a bit ambiguity may occur in the down counter operation. Thus when adjusting these resistors a position should be found that zeros the display and also stabilizes the right edge of the bar graph.

Thus, in summary, the scale 57 is produced by the CRT controller 7-U1 activating the dot matrix character generator 7-U2 to produce on the display screen the lower case 1 and the apostrophe characters derived from the character generator 7-U2 and stored in the refresh video memory 8-RM at the appropriate character locations to produce the long and short vertical lines producing the scale display. The bar graph 58 is located on the screen by use the programable cursor pulses from the CRT controller chip 7-U1, and produce the bar graph pulse 50a for 5 scan lines by reason of the programming of the CRT controller 7-U1. Exact registration of the bar graph 58 and scale 57 is accomplished by adjustable delay of the cursor pulses produced by adjusting the resistors 9-R1 and 9-R2 as described to "zero" the bar graph display. Exclusive OR gate 7-U8A (FIG. 7b) inverts the serial video when activated by the flasher switch signals indicating that the modulation exceeds accepted percentage levels to invert the serial video, which, in the inverted state causes a black character to appear on a white background, and thus the + or − signs below the bar graph to appear to flash on and off as the exclusive OR circuit 7-U8A is flipped back and forth.

While the system shown in FIG. 1 includes an AM modulation monitor for an amplituded modulated RF carrier, it is within the scope of this invention that frequency modulated (FM) broadcasts, and television broadcasts may be monitored using appropriate percentage modulation monitors, and that the percentage modulation data obtained may be processed and displayed in the same manner as described herein with respect to the AM modulated broadcast system shown in FIG. 1.

While in the foregoing there has been described and shown a preferred embodiment of the invention, various modifications and equivalents may be resorted to within the spirit and scope of the invention as claimed.

What is claimed is:

1. A percentage modulation remote display system for displaying at a remote station the percentage modulation of a radio signal detected at a transmitter station, comprising a transmitter station, a radio transmitter located at said transmitter station, a percentage modulation monitor means at the transmitter station for monitoring the percentage modulation of the radio signal transmitted by said transmitter and producing an analog output signal which is a function of percentage modulation, an analog to digital converter means at the transmitter station for converting said analog signal to a parallel bit digital signal of a predetermined number of bits, first timing means controlling said analog to digital converter for determining the time rate of conversion of the analog signal to the digital signal, a parallel to serial converter means at the transmitter station for converting said parallel bit digital signal to a serial data stream, a remote station, a serial to parallel data converter means at the remote station for converting the serial data received from said parallel to serial data converter means to digital parallel bit data, a signal transmission line connecting said parallel to serial converter means at the transmitter station with the serial to parallel converter means at the remote station, a down counter at the remote station connected to said serial to parallel converter for receiving said digital parallel bit data, second timing means for periodically presetting the down counter to the digital parallel bit data value and for producing a start pulse for initiating the beginning of a bar graph pulse, a clock oscillator for decrementing said down counter, a digital AND gate for producing a bar graph pulse, said digital AND gate being controlled by said start pulse from said timing circuit means to initiate said bar graph pulse and being controlled by said down counter when it reaches the count of zero to end said bar graph pulse, and a television display means for displaying said bar graph pulse as an illuminated bar graph on the screen of said television display means, the length of said bar representing the percentage modulation value of the radio signal transmitted from said transmitter, said second timing means having means for also starting the bar graph pulse at the desired location on the TV screen and for applying the bar graph pulse for a predetermined number of scan lines of the TV raster.

2. The remote display system of claim 1, having a video mixer connected between said AND gate and said television display means for receiving and mixing said bar graph pulse and other video data, a source of other video data feeding into said video mixer, said video mixer feeding mixed video data including said bar graph pulse and other video data to said television display means.

3. The system of claim 2 wherein said source of other video data includes a source of scale markings representing values of percent modulation.

4. The system of claim 3 wherein said modulation monitor means includes means for producing positive and negative over modulation alarm signals, means controlled by said first timing means for periodically sampling said positive and negative over modulation alarm signals and feeding said alarm signal to said parallel to serial converter, said parallel to serial converter feeding said alarm signals via said transmission line to said serial to parallel converter at the remote station, and said source of other video data includes means feeding said alarm signals from the serial to parallel converter to said video mixer which applies said alarm signals to said TV display means where the alarm signals are displayed as distinctive signals when positive or negative over modulation occurs, there being separate symbols for indicating positive and negative over modulation and plus and minus indicators to indicate the positive and negative marks respectively.

5. The system of claim 1 wherein said first timing means controls said analog to digital converter to make sixty conversions per second of said analog signal to said parallel bit digital signal.

6. A method for remote display of percentage modulation of a broadcast transmission in the form of a modulated broadcast carrier wave measured at a transmitter site comprising continuously measuring the percentage modulation of the broadcast carrier wave at the transmitter site and producing an analog value representing percentage modulation, periodically converting the analog value to digital parallel bit data at a predetermined frequency, converting the digital parallel bit data into serial digital data form and transmitting the serial digital data through a conductor to a remote station, reconverting the serial digital data to parallel bit digital data, periodically producing a bar graph pulse at said predetermined frequency whose length corresponds to the value of said parallel bit digital data reconverted from said serial digital data form, displaying said bar graph pulse on a TV display screen as an illuminated bar graph which begins at a desired point on said TV screen corresponding to zero percentage modulation, generating scale marker pulses corresponding to scale divisions representing percentage modulation values, and producing illuminated scale markers across said TV screen parallel to said bar graph from which the percentage modulation value of said bar graph can be read.

7. The method of claim 6 wherein said bar graph pulse is produced by periodically setting the parallel bit digital data into a down counter at said predetermined frequency, initiating a bar graph pulse each time the parallel bit digital data is set into said down counter, down counting said down counter and terminating each bar graph pulse when said down counter reaches the count of zero.

8. A remote display system for displaying percentage modulation of a broadcast transmission in the form of a modulated broadcast carrier wave measured at a transmitter site comprising means for continuously measuring the percentage modulation of the broadcast carrier wave at the transmitter site and producing an analog value representing percentage modulation, means for periodically converting the analog value to digital parallel bit data at a predetermined frequency, means for converting the digital parallel bit data into serial digital data form and transmitting the serial digital data through a conductor to a remote station, means for reconverting the serial digital data to parallel bit digital data, means responsive to said last-mentioned digital data for periodically producing a bar graph pulse at said predetermined frequency whose length corresponds to the value of said parallel bit digital data, television display means including a TV display screen and means for displaying said bar graph pulse on said screen as an illuminated bar graph which begins at a desired point on said TV screen corresponding to zero percentage modulation, and means for generating scale marker pulses corresponding to scale divisions representing percentage modulation values and producing illuminated scale markers across said TV screen parallel to said bar graph from which the percentage modulation value of said bar graph can be read.

* * * * *